(12) United States Patent
Chao

(10) Patent No.: US 6,424,528 B1
(45) Date of Patent: Jul. 23, 2002

(54) HEATSINK WITH EMBEDDED HEAT PIPE FOR THERMAL MANAGEMENT OF CPU

(75) Inventor: Shun-lung Chao, Plano, TX (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 08/879,592

(22) Filed: Jun. 20, 1997

(51) Int. Cl.[7] .................................................. H05K 7/20
(52) U.S. Cl. ..................... 361/700; 165/104.33; 257/715
(58) Field of Search ................................ 361/687, 699, 361/700, 702, 703, 717–719; 174/15.2; 165/80.3, 80.4, 104.33; 62/259.2; 257/714, 715, 722

(56) References Cited

U.S. PATENT DOCUMENTS

| | | |
|---|---|---|
| 4,448,028 A | 5/1984 | Chao et al. |
| 4,612,978 A | 9/1986 | Cutchaw |
| 5,095,404 A | 3/1992 | Chao |
| 5,253,702 A | 10/1993 | Davidson et al. |
| 5,329,993 A | 7/1994 | Ettehadieh |
| 5,331,510 A | 7/1994 | Ouchi et al. |
| 5,367,193 A | 11/1994 | Malladi |
| 5,398,768 A | 3/1995 | Staples |
| 5,412,535 A | 5/1995 | Chao et al. |
| 5,461,766 A | 10/1995 | Burward-Hoy |
| 5,572,070 A | 11/1996 | Ross |
| 5,598,320 A * | 1/1997 | Toedtman |
| 5,697,428 A * | 12/1997 | Akachi |
| 5,699,227 A | 12/1997 | Kolman et al. |
| 5,704,416 A * | 1/1998 | Larson |
| 5,712,762 A * | 1/1998 | Webb |
| 5,737,171 A | 4/1998 | Buller et al. |
| 5,875,095 A * | 2/1999 | Webb |
| 5,880,524 A | 3/1999 | Xie |

OTHER PUBLICATIONS

"Conduction cooled—Package", Dombrowskas, IBM Tech Discl Bull, vol. 13 No. 2 Jul. 1970, pp442.*
Thermacore Inc. publication entitled, "Heat Pipe Systems For Passive Cooling of Personal Computers," pp. 1–25.

* cited by examiner

Primary Examiner—Gerald Tolin
(74) Attorney, Agent, or Firm—Conley, Rose & Tayon, PC; B. Noel Kivlin

(57) ABSTRACT

A heatsink for dissipating thermal energy generated by a microprocessor and neighboring peripheral components. The heatsink is affixed to a printed circuit board within a computer housing. The heatsink includes a thermally conductive base, a plurality of thermally conductive fins, and a heat pipe. The thermally conductive base includes substantially planar upper and lower surfaces displaced from each other by a thickness of the base. The base defines a first channel, proximal to the lower surface, extending from a first end of the base to a second end. The plurality of conductive fins extends substantially perpendicularly from the upper surface of the base. Each of the plurality of fins includes substantially planar proximal and distal major surfaces displaced from each other by a thickness of the fin. The heat pipe is contained within the first channel. The heat pipe includes an elongated casing containing a heat transfer medium and a wick. The wick is immersed in the medium extending along a major access of the heat pipe. The heatsink is configured to be affixed to the printed circuit board with the heat pipe aligned over the center of the microprocessor and the lower surface of the heatsink in close proximity with an upper surface of the microprocessor.

18 Claims, 5 Drawing Sheets

HEATSINK WITH EMBEDDED HEAT PIPE FOR THERMAL MANAGEMENT OF CPU

BACKGROUND OF THE INVENTION

1. Field of the Invention

The present invention relates to heatsinks and more particularly to a heatsink including an embedded heat pipe for thermally managing a high power CPU in a desktop computer.

2. Description of the Relevant Art

A computer system typically includes, at a minimum, an input/output (I/O) port, a central processing unit (CPU), a read only memory (ROM), a random access memory (RAM), and a signal bus. Desktop computers and other similar workstations, typically include a printed circuit board (or "motherboard") to which the CPU, memory components (such as ROM and RAM integrated circuits), I/O control, and discrete components such as resistors and capacitors are affixed and selectively interconnected via conductive traces within the printed circuit board. The power dissipated by a typical CPU generates large amounts of thermal energy. Advances in CPU speed and bus throughput have further compounded this problem.

Conventional desktop computers are typically thermally managed by forcing ambient air across the motherboard and particularly across the CPU through the use of a fan placed upon the minicomputer chassis and, in some instances, an additional fan placed directly above the CPU. In lieu of or in addition to a fan, many desktop manufacturers further employ a conventional heatsink upon the CPU. A heatsink is generally made of metal having opposed surfaces, wherein one surface is mostly flat while the other surface includes a plurality of outward-extending fins. The flat surface is thermally bonded to the encapsulated CPU, allowing the fins to project into the ambient air within the desktop chassis. A silicon compound is often used as the thermal bonding agent. The metal fins function similar to a metal radiator in that they remove heat from the thermally bonded, underlying CPU by means of conduction, convection and radiation.

CPUs and other integrated circuits designed for desktop applications are typically required to operate within a specified temperature range. Industry custom is to specify the "case temperature" operating range for a given integrated circuit. The case temperature ($T_C$), for purposes of this disclosure, refers to the temperature at the top center of the integrated circuit package. The case temperature is related to the junction temperature $T_J$ and the ambient temperature $T_A$ as follows:

$$T_J + T_C + (P^* \Theta_{JC}) \qquad \text{Eq.1}$$

$$T_A = T_J - (P^* \Theta_{JA}) \qquad \text{Eq.2}$$

where:

$T_A$ = ambient temperature (° C.)
$T_J$ = average junction temperature (° C.)
$T_C$ = case temperature at top center of package (° C.)
P = power dissipated by the integrated circuit (W)
$\Theta_{JC}$ = junction-to-case thermal resistance (° C./W)
$\Theta_{JA}$ = junction-to-ambient thermal resistance (° C./W)
combing Eq. 1 and Eq. 2 and rearranging yields:

$$T_C = T_A + P^* \Theta_{CA} \qquad \text{Eq.3}$$

where $\Theta_{CA} = (\Theta_{JA} - \Theta_{JC})$

Equation 3 reveals that an increase in power P results in an increase in the case temperature $T_C$ as well unless steps are taken to reduce the ambient temperature $T_A$, reduce the case-to-ambient thermal resistance $\Theta_{CA}$, or both. In most environments in which desktop computers are operated, the consideration of human comfort and the cost of air conditioning place a minimum temperature beyond which reducing the ambient temperature is unfeasible. To remain within the operating specifications of a high power CPU, it is therefore typically necessary to reduce the thermal resistance.

In many applications, conventional heatsinks as described above provide a cost effective mechanism for dissipating heat and thereby effectively reducing the thermal resistance of the integrated circuit. With the advent of high power CPUs (i.e., CPUs that consume greater than approximately 40 Watts), conventional heatsink design is typically unable to adequately dissipate the generated heat. A need therefore exists for a thermal management system within a high power CPU desktop computer which is both cost effective and operably superior to conventional heatsinks.

SUMMARY OF THE INVENTION

The problems identified above are in large part addressed by a heatsink for dissipating thermal energy generated by a microprocessor. The heatsink includes a thermally conductive base, a plurality of conductive fins, and a heat pipe contained within the base. The heat pipe distributes heat generated by a concentrated heat source such as the CPU to the peripheral portions of the heatsink for more efficient thermal management.

Broadly speaking, the present invention contemplates a heatsink for dissipating thermal energy generated by a microprocessor and neighboring peripheral components. The heatsink is affixed to a printed circuit board within a computer housing. The heatsink includes a thermally conductive base, a plurality of thermally conductive fins, and a heat pipe. The thermally conductive base includes substantially planar upper and lower surfaces displaced from each other by a thickness of the base. The base defines a first channel, proximal to the lower surface, extending from a first end of the base to a second end. The plurality of conductive fins extends substantially perpendicularly from the upper surface of the base. Each of the plurality of fins includes substantially planar proximal and distal major surfaces displaced from each other by a thickness of the fins. The heat pipe is contained within the first channel of the base. The heat pipe includes an elongated casing containing a heat transfer medium and a wick. The wick is immersed in the medium extending along a major access of the heat pipe. The heatsink is configured to be affixed to the printed circuit board with the heat pipe aligned over the center of the microprocessor and the lower surface of the heatsink in close proximity with an upper surface of the microprocessor.

The thermally conductive base, in a presently preferred embodiment, is comprised of aluminum, copper, silver, tungsten or any appropriate alloy thereof. In one embodiment, the base is substantially rectangular and has a thickness in the range of approximately 2 to 20 mm. A length of the base in a presently preferred embodiment is in the range of approximately 100 to 155 mm. The width of the base is preferably in the range of approximately 50 to 100 mm. Each of the plurality of thermally conductive fins is similarly sized and each of the major surfaces is substantially rectangular. In one presently preferred embodiment, the plurality of fins are arranged upon the base upper surface in an array comprised of a plurality of rows and columns. In one embodiment, the major surfaces of the fins are oriented perpendicular to a direction of the columns. Each of the fins extends to a height above the upper surface that is greater than a gap between adjacent rows by a factor in the range of approximately 10 to 20. The height of the fins in a preferred embodiment is in the range of approximately 30 to 40 mm and the gap between adjacent rows is preferably in the range of approximately 1.5 to 4.0 mm.

In a preferred embodiment, the plurality of fins and the conductive base are fabricated from a continuous piece of material such that the fins are integrally formed with and connected to the conductive base. The heat pipe casing in a preferred embodiment is made of copper or aluminum. A cross-section of the heat pipe casing in a first embodiment is substantially rectangular. In this embodiment the first channel preferably comprises a rectangularly shaped trench formed into the lower surface of the conductive base. In an alternative embodiment, the heat pipe casing is substantially circular in cross-section and the first channel is a circular tunnel suitably drilled or extruded into the conductive base proximal to the lower surface. The heat pipe fluid is ideally water, acetone, methanol, or ethanol. The conductive base may further include a second channel where the second channel extends substantially perpendicularly to the first channel. In this embodiment, the heatsink ideally further includes a second heat pipe contained within the second channel. The conductive base, in one embodiment, may still further include first and second diagonal channels. The diagonal channels suitably extend between respective corners of the base. In such an embodiment, the heatsink further includes first and second diagonal heat pipes contained within the first and second diagonal channels respectively.

The present invention further contemplates a motherboard for use in a computing system. The motherboard includes a printed circuit board, a central processing unit, a random access memory device, and a heatsink. The central processing unit is affixed to the printed circuit board. The random access memory is affixed to the circuit board and interfaced to the central processing unit. The heatsink is a heatsink according to the heatsink of the present invention. The heatsink is affixed to the printed circuit board with the heat pipe aligned over a center of the microprocessor. The lower surface of the heatsink is in close proximity with an upper surface of the microprocessor.

BRIEF DESCRIPTION OF THE DRAWINGS

Other objects and advantages of the invention will become apparent upon reading the following detailed description and upon reference to the accompanying drawings in which.

FIGS. 7 and 8 show bottom views of alternative embodiments of the heatsink of FIG. 1.

Figure 1:
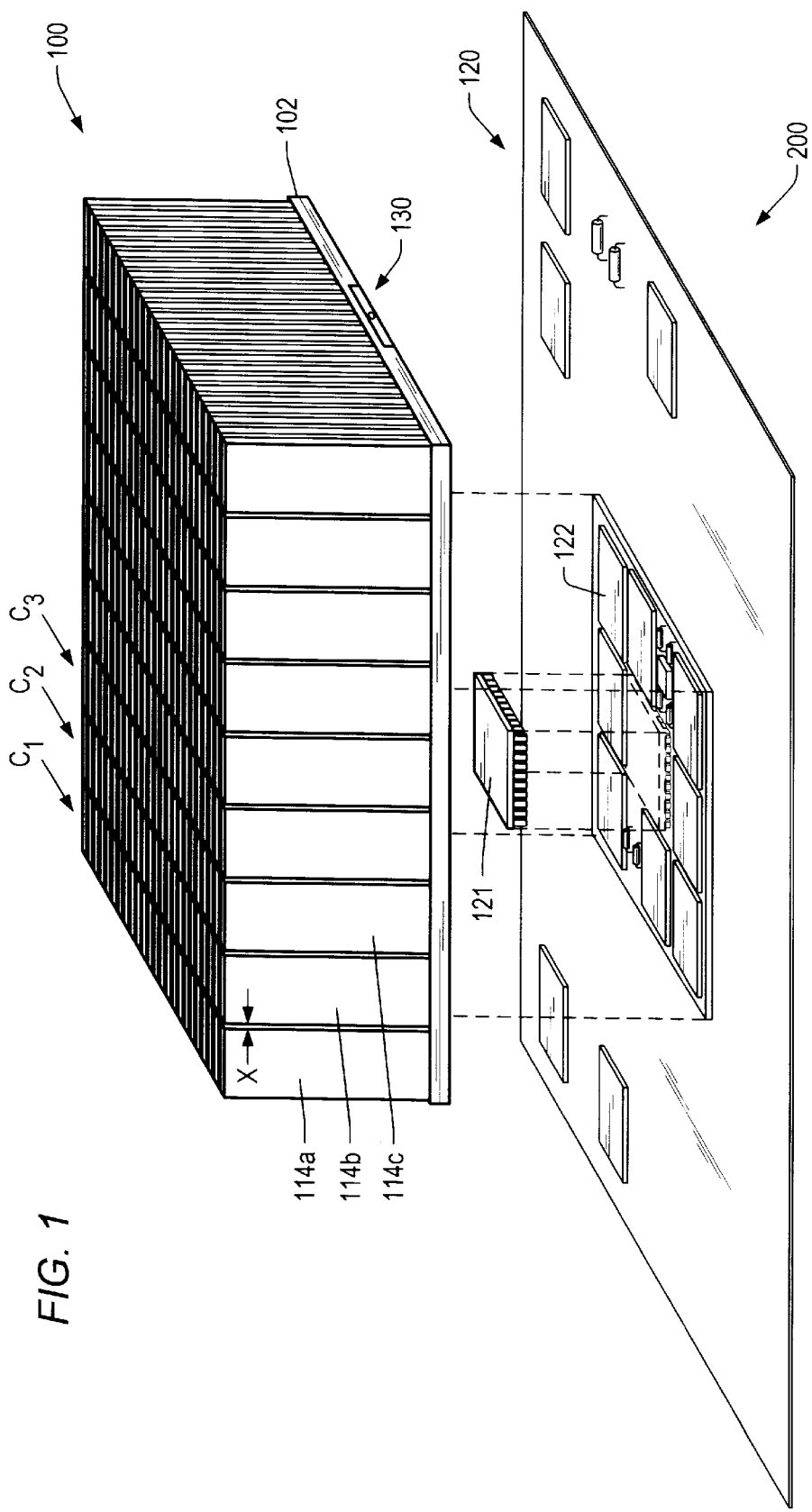
FIG. 1 is an exploded perspective view of a motherboard including a printed circuit board, a CPU, a random access memory device, and a heatsink according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a motherboard 200 for use in a computing system such as a desk top computer. Motherboard 200 includes a printed circuit board 120, a central processing unit (CPU) 121 affixed to printed circuit board 120, at least one random access memory device 122, and a heatsink 100. Printed circuit board 120, as is well known in the field of electronics, may comprise for example, a plurality of laminated insulating layers and including one or more layers of conductive traces for selectively routing signals among the various electronic components affixed to the printed circuit board. CPU 121 is configured to fetch and execute computer instructions residing within resident or external memory. Heatsink 100 is optimized for use with high power central processing units. For purposes of this application, a high power central processing unit refers to a CPU 121 which consumes in excess of approximately 40 watts during normal operation. As discussed in the background section, conventional heatsinks are typically unsuitable for use with high power CPUs in applications where the ambient temperature is the average room temperature of, for example, an office building or manufacturing environment. Nevertheless, high powered CPUs are increasingly penetrating the consumer and desk top computing application market. Accordingly, it is imperative to provide an efficient and cost effective method of dissipating the thermal energy produced by CPU 121.

In addition to CPU 121, printed circuit board 120 includes at least one random access memory device 122. Random access memory device 122 may include, for example, a static RAM use for an external cache or a dynamic RAM device used for main storage as is well known in the field of microprocessor system architecture. Random access memory device 122 is affixed to circuit board 120 and interfaced with CPU 121. Motherboard 200 further includes heatsink 100 according to the present invention.

Heatsink 100 dissipates thermal energy generated by microprocessor 121 and neighboring peripheral components affixed to PC board 120 such as random access memory device 122. Heatsink 100 includes a thermally conductive base 102, a plurality of conductive fins, three of which are identified in FIG. 1 by reference numerals 114a, 114b, and 114c. (For purposes of simplicity and brevity, the plurality of conductive fins are collectively referred to herein as conductive fins 114 or fins 114.) Heatsink 100 further includes a heat pipe 130.

Figure 1A:
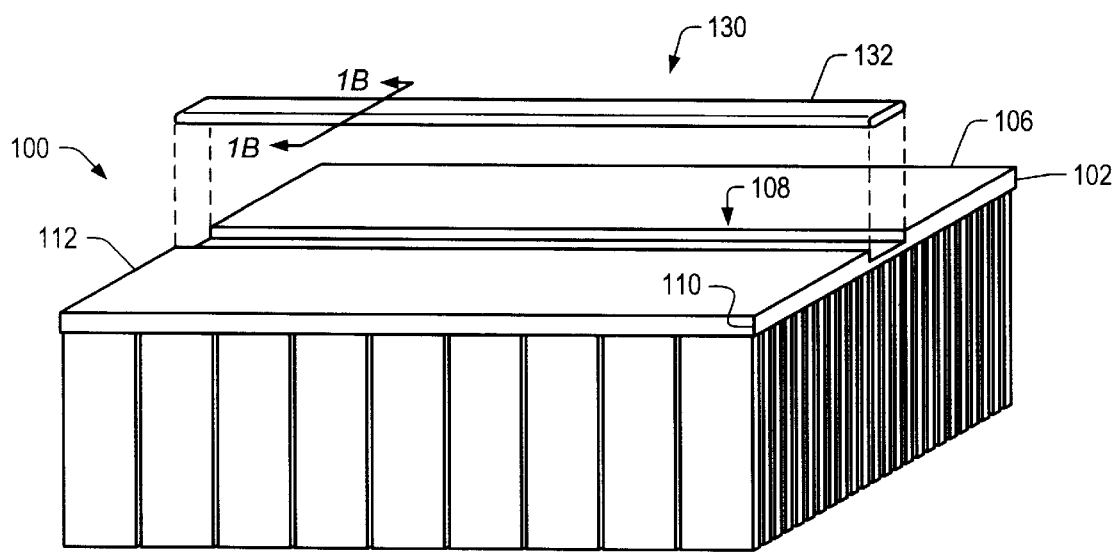
FIG. 1A is a perspective view of the heatsink of FIG. 1.
Figure 2:
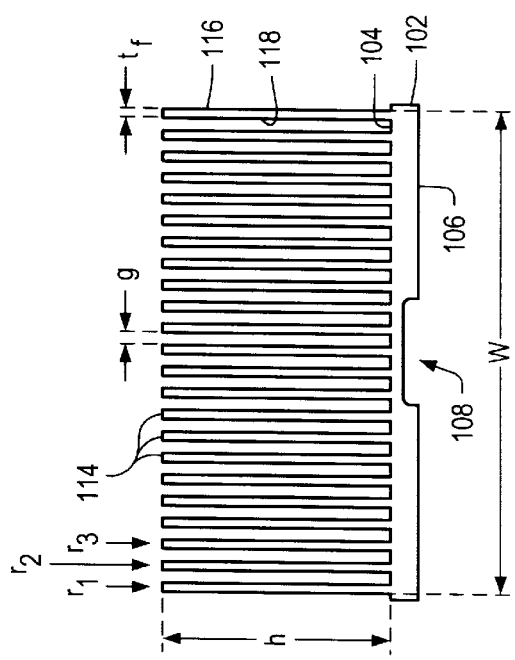
FIG. 2 is a side view of the heatsink of FIG. 1.
Figure 3:
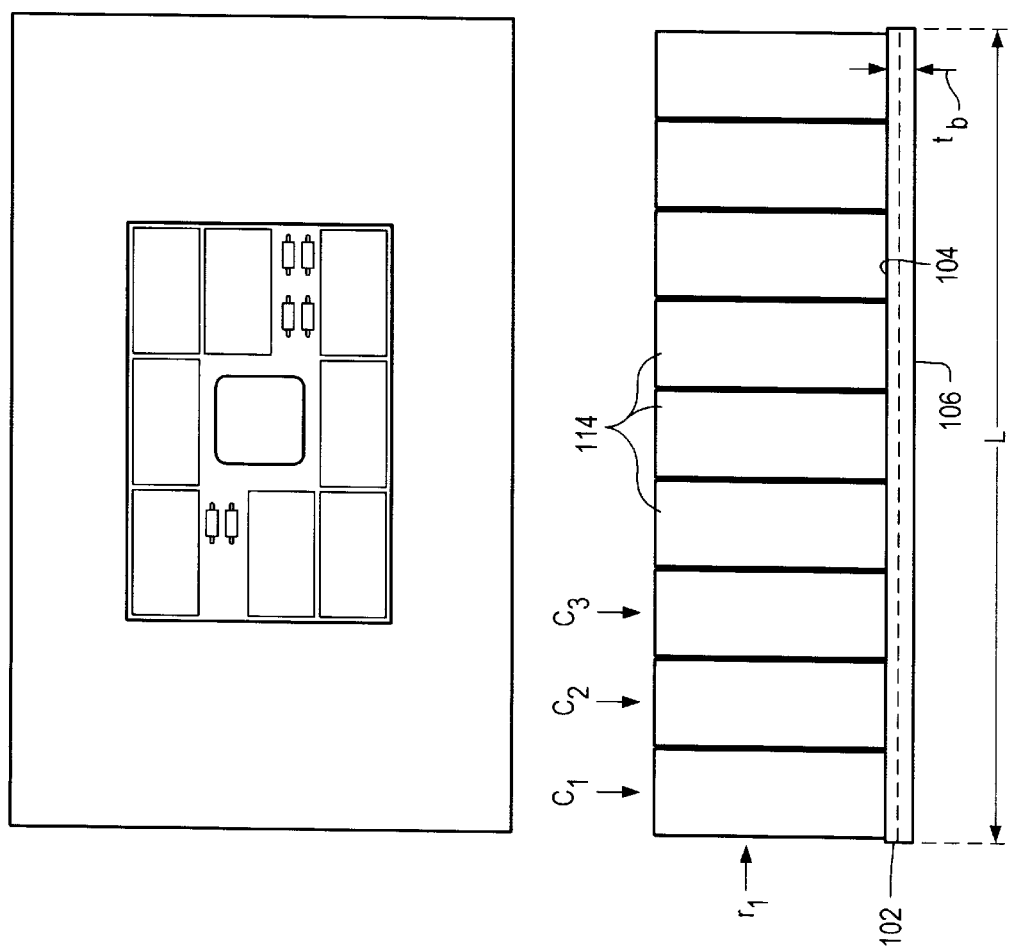
FIG. 3 is a front view of the heatsink of FIG. 1.

Thermally conductive base 102 includes a substantially planar upper surface 104 and a substantially planar lower surface 106 (upper surface 104 and lower surface 106 are more easily seen in FIG. 2 and FIG. 3). In the preferred embodiment, upper surface 104 and lower surface 106 are substantially planar and parallel to each other and are displaced from each other by a thickness $t_b$ of base 102. In one presently preferred embodiment, base thickness $t_b$ is in the range of approximately 2 to 20 mm. As seen in FIG. 1A and FIG. 2, base 102 defines a first channel 108 proximal to lower surface 106 and extending from a first end 110 to a second end 112 of base 102. In the embodiment shown in FIG. 1A and FIG. 2, first channel 108 comprises a substantially rectangular trench extending from lower surface 106 of base 102. First channel 108 may be suitably formed within base 102 by conventional extrusion lathe or routing techniques. In the preferred embodiment, first channel 108 traverses a length L (shown in FIG. 3) of base 102.

Each of the thermally conductive fins 114 extends substantially perpendicularly from upper surface 104 of base 102. Each of the fins 114 includes a pair of substantially planar major surfaces referred to for purposes of identification in this disclosure as the proximal and distal major surfaces 116 and 118 respectively. Proximal major surface 116 and distal major surface 118 are displaced from each other by a thickness $t_f$ of fin 114.

Figure 4:
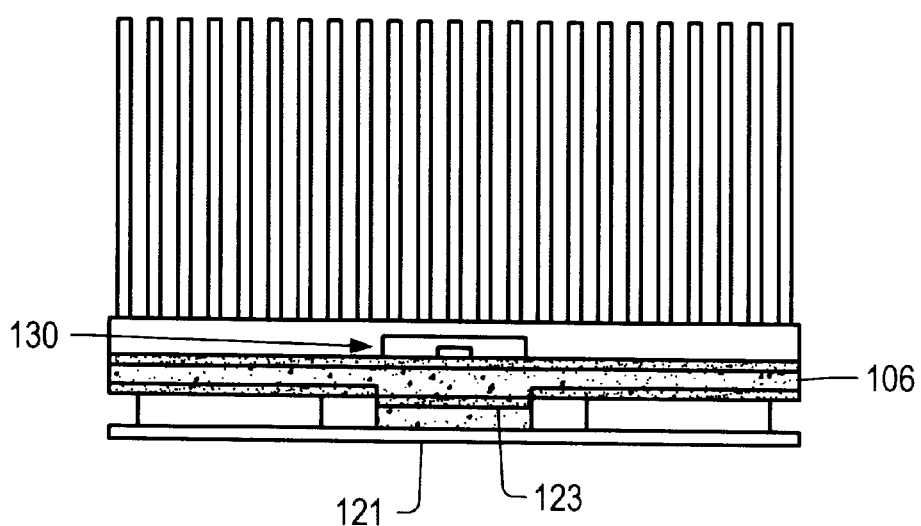
FIG. 4 is a side view of a heatsink affixed to the printed circuit board such that the heat pipe is aligned over the CPU with a lower surface of the heatsink in close proximity to an upper surface of the CPU.

Heat pipe 130 includes an elongated heat pipe casing 132 which contains a heat transfer medium 136 (shown in FIG. 1B) and a wick 134 immersed in medium 136. Wick 134 extends along a major access of heat pipe 130. Referring briefly to FIG. 4, heatsink 100 is configured to be affixed to printed circuit board 120 with heat pipe 130 aligned over a center of microprocessor 121 and located such that lower surface 106 of base 102 is in close proximity with an upper surface 123 of microprocessor 121. (For purposes of this disclosure, close proximity is defined as a displacement less than approximately 3 mm.) In the embodiment shown in FIG. 4, lower surface 106 of base 102 and upper surface 123 of semiconductor substrate 121 are separated only by a film of thermal paste as is well known in the field of heatsink applications. It is noted that a suitable conductive plate may be inserted between base 102 and microprocessor 121 wherein the plate is coated on both sides with a thermal paste. An appropriate conductive plate may be comprised as an example, of a copper tungsten alloy.

As previously mentioned, base 102 comprises a thermally conductive material. For purposes of this disclosure, a thermally conductive material refers to a material having a thermal conductivity k greater than approximately 10 cal/m-° C.-s. Suitable materials for conductive base 102 include aluminum, copper, silver, tungsten, and appropriate alloys thereof. In the presently preferred embodiment, aluminum is used for conductive base 102 because of its thermal conductivity, its weight, its durability, and its relatively low cost. In a preferred embodiment useful in typical motherboard applications, base 102 of heatsink 100 is substantially rectangular. In an embodiment particularly useful for motherboards in which the central processing unit 121 consumes greater than approximately 50 watts and wherein the microprocessor 121 is surrounded by 1 or more random access memory devices 122, (wherein each random access memory device consumes in excess of 1 watt), a length of base 102 is preferably in the range of approximately 100 to 155 mm while a width of base 102 is in the range of approximately 50 to 100 mm.

In the preferred embodiment, the plurality of thermally conductive fins 114 are each sized similarly and each comprises a major surface that is substantially rectangular. In an embodiment suitable for its efficient dissipation of thermal energy or heat, the plurality of fins 114 are arranged upon upper surface 104 of base 102 as an array of fins. The array includes a plurality of rows r and columns c as shown in FIG. 1. Adjacent columns within heatsink 100 are displaced by a cross-cut groove having a lateral dimension x in the range of approximately 2 to 10 mm. The cross-cut grooves separating adjacent columns beneficially facilitate increased air flow through the array of heatsink 100 without substantially decreasing the total available surface area of the plurality of fins 114. Columns are designated for purposes of this application as running perpendicular to major surfaces 116 and 118 of fins 114.

Turning more specifically to FIG. 2, a side view of heatsink 100 is shown. As indicated in FIG. 2, each fin 114 extends to a height h above upper surface 104 of base 102 and is separated from an adjacent fin 114 by a gap g. In the presently preferred embodiment, the ratio of the height h to the gap g is in the range of approximately 10:1 to 20:1. In a presently preferred embodiment suitable for use with a 75 watt CPU, the ratio of height h to gap g is still more preferably approximately 15. The height h is preferably in the range of approximately 30 to 40 mm while the gap g between adjacent rows r is in the range of approximately 1.5 to 4.0 mm. As will be appreciated to those skilled in the art, maximum dissipation of heat by thermal conduction is facilitated if the plurality of conductive fins 114 are integrally formed with base 102. In other words, it is desirable to fabricate conductive fins 114 and conductive base 102 from a single continuous piece of material. A suitable heatsink 100 may be fashioned in this manner using gang-cutting or extrusion processes. Accordingly, the plurality of conductive fins 114 are ideally comprised of the same material as the material used for conductive base 102 including, as mentioned previously, aluminum, copper, silver, tungsten or an alloy thereof.

Figure 1B:
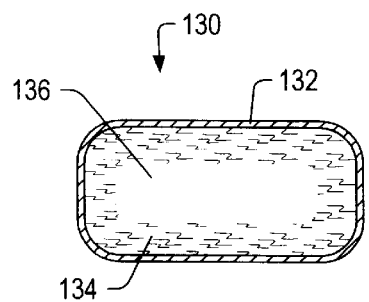
FIG. 1B is a cross-sectional view of the heat pipe of FIG. 1A.

Referring to FIGS. 1A and 1B, heat pipe 130 is shown. Heat pipe 130 is contained within first channel 108 of base 102. Heat pipe 130 includes an elongated heat pipe casing 132. Casing 132 is made of a thermally conductive material capable of enclosing a vacuum. Suitable materials for heat pipe casing 132 include, aluminum or, more preferably, copper. Elongated housing 132 is typically filled with a heat transfer medium 136. Heat transfer medium 136 is a phase changing fluid that efficiently transports energy through its latent heat of vaporization and condensation. In the presently preferred embodiment, heat pipe medium 136 simply comprises water. In other embodiments, heat pipe medium 136 may comprise acetone, methanol, or ethanol. Heat pipe 130 further includes a wick 134. Wick 134 is a structure that generates a capillary pressure which transports heat transfer medium 136 from a low temperature or condenser portion of the heat pipe to a high temperature or evaporator portion of the heat pipe. A suitable material used in the preferred embodiment of the wick 134 includes copper powder metal.

Figure 5:
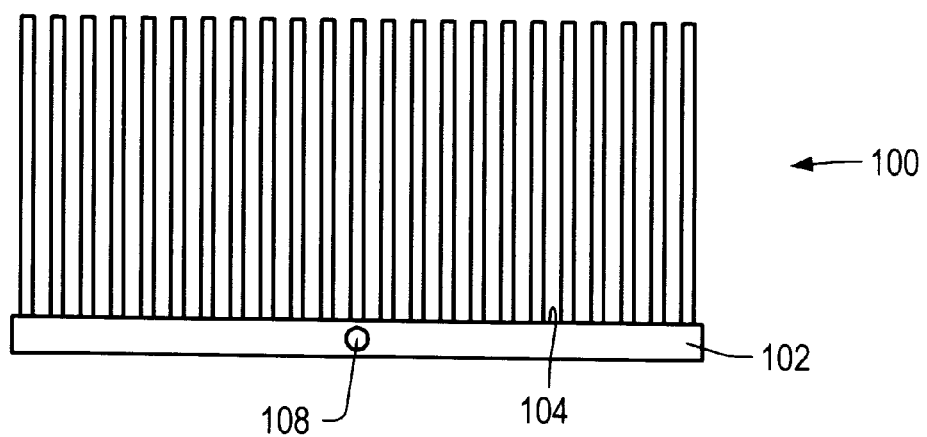
FIG. 5 is a side view of an alternative embodiment of the heatsink of FIG. 2.
Figure 7:
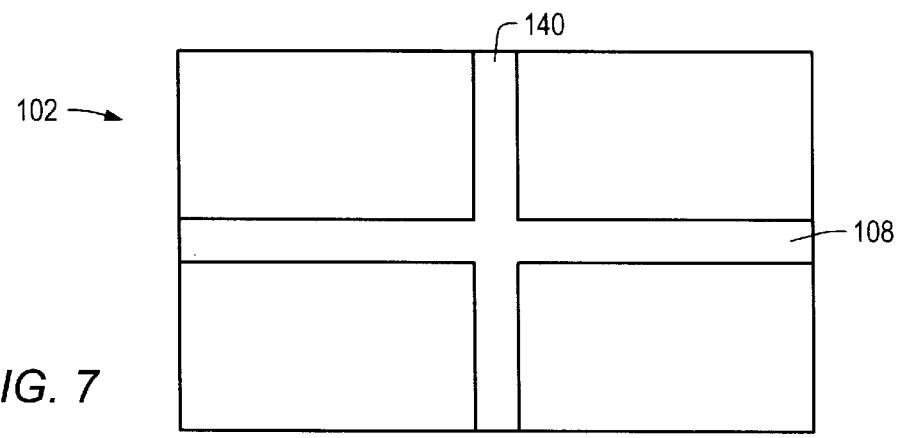
FIG. 7 is a bottom view of an alternative embodiment of the heatsink of FIG. 2
Figure 8:
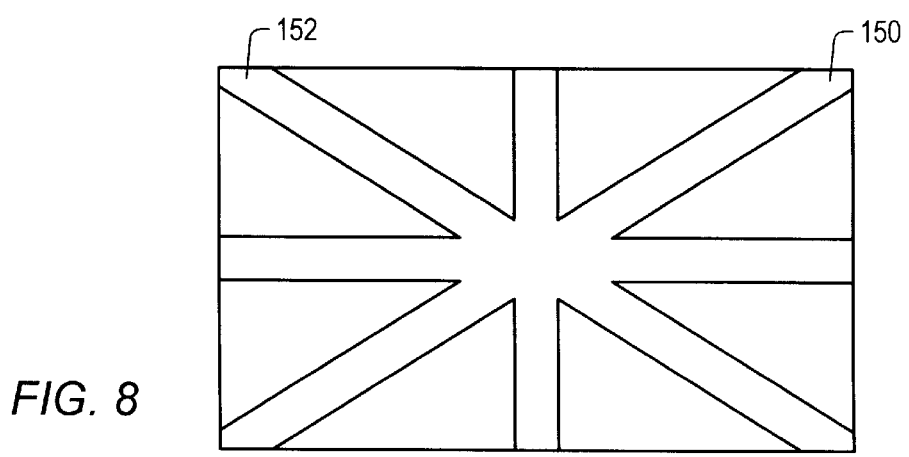

In the embodiment shown in FIGS. 1 and 1A, a cross-section of heat pipe 130 is substantially rectangular in shape and first channel 108 comprises a similarly shaped trench. Turning to FIG. 5, an alternative embodiment of heatsink 100 is shown in which the channel 108 is substantially circular in cross-section. As will be appreciated, a suitable heat pipe 130 for use with the embodiment of FIG. 5 will have a circular cross-section to conform with the cross-section of channel 108. A circular channel 108 may be suitably formed in base 102 heatsink 100 with a conventional drilling or extrusion process which may beneficially reduce the complexity and cost associated with fabricating first channel 108. FIGS. 1 and 1A disclose a single channel 108 for containing a single heat pipe 130. Turning to FIGS. 7 and 8, alternative channel embodiments are shown. FIG. 7 shows a bottom view of heatsink 100 in which a second channel 140 has been formed in lower surface 106 of base 102. It will be appreciated that a second heat pipe (not shown in the drawings) may be included in second channel 140 to further facilitate heat transfer away from the center of heatsink 100. FIG. 8 shows still another embodiment in which diagonal trenches 150 and 152 are further fabricated into lower surface 106 of base 102. Additional heat pipes (not shown in the drawings) may be incorporated into these diagonal channels to yet still further improve the ability of heatsink 100 to dissipate thermal energy generated by microprocessor 121 and surrounding peripheral components. The embodiments of channels shown in FIGS. 7 and 8 is meant to be representative only in that it will be appreciated to those skilled in the art of heatsink technology that alternative embodiments and arrangements of channels in heat pipes may be suitably incorporated into the present invention.

Figure 6:
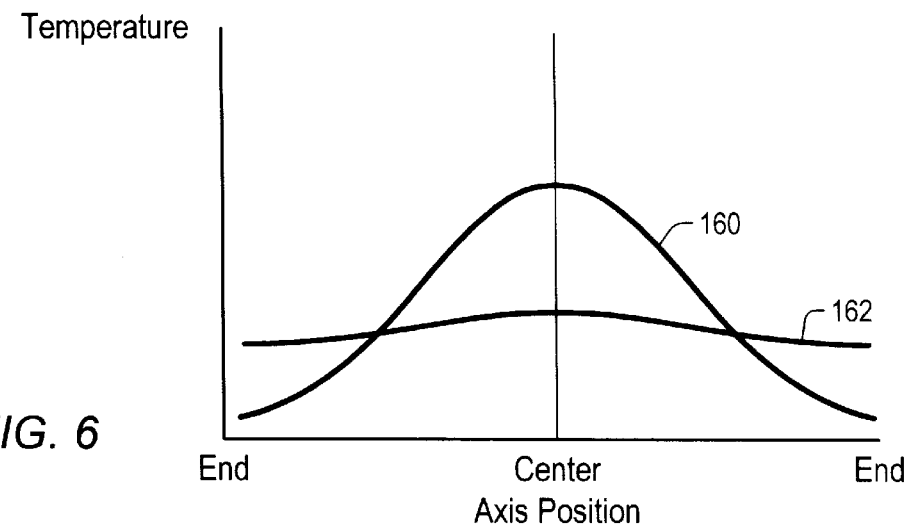
FIG. 6 is a graph of heatsink temperature versus position for a heat pipe and non-heat pipe application.

Turning to FIG. 6, a graph of heatsink temperature versus heatsink position is shown where position refers to the displacement along either horizontal or vertical axis of conductive base 102 for a heat pipe and a non-heat pipe application. The non-heat piped heat distribution is represented in FIG. 6 by the line 160. The center axis position shown in FIG. 6 represents the position of the center of microprocessor 121. As might be anticipated, the non-heat sinked application includes a relatively sharp heat peak at the center axis position and contains a relatively steep temperature drop from the center axis position to either end of the heat sink. Heat piped application graph 162, on the other hand, shows a substantially uniform heat distribution independent of the axis position. Thus, it will be appreciated that the inclusion of the heat pipe 130 within heatsink 100 beneficially reduces or smoothes the heat gradient across heatsink 100. By eliminating the high temperature peak at the center access position, the present invention beneficially enables the operation of high powered central processing units within the thermal specifications of the central processing unit without requiring a reduction in the ambient temperature in which the central processing unit is operated. It is believed that a suitably arranged heatsink according to the present invention together with a relatively moderate air flow of approximately 300 feet per minute is capable of maintaining a 75 watt central processing unit and up to 8 surrounding memory devices each dissipating approximately 3 watts within the thermal specifications typically indicated for commercial and consumer use (i.e., a maximum case temperature in the range of approximately 85° C.).

It will be appreciated to those skilled in the art that the present invention is believed to be capable of enabling the operation of the high power central processing unit and surrounding peripheral components at an acceptable temperature without significant additional heat management apparatus. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A heatsink for dissipating thermal energy generated by an integrated circuit, said heatsink comprising:
   a thermally conductive base including a substantially planar lower surface for abutting against the integrated circuit, wherein said base defines a first channel, proximal to said lower surface extending from a first side of said base to a second side of said base;
   a plurality of thermally conductive fins extending from an opposite upper surface of said base; and
   a heat pipe contained within said first channel, wherein said heat pipe comprises an elongated casing containing a heat transfer-medium and a wick immersed in said medium and extending along a major axis of said heat pipe, and wherein one end of said heat pipe terminates within said base proximate to the first side and a second end of said heat pipe terminates within said base proximate to the second side.

2. The heatsink of claim 1, wherein said thermally conductive base comprises a material selected from the group comprising aluminum, copper, silver, tungsten and appropriate alloys thereof.

3. The heatsink of claim 1, wherein said base is substantially rectangular and wherein a thickness of said base is in the range of approximately 2 to 20 mm.

4. The heatsink of claim 3, wherein a length of said base is in the range of approximately 100 to 155 mm.

5. The heatsink of claim 3, wherein a width of said base is in the range of approximately 50 to 100 mm.

6. The heatsink of claim 1, wherein each of said plurality of thermally conductive fins is similarly sized and wherein each of said major surfaces is substantially rectangular.

7. The heatsink of claim 6, wherein said plurality of fins are arranged upon said base upper surface in a fin array comprised of a plurality of rows and columns, wherein said major surfaces of said fins are oriented perpendicular to a direction of said columns.

8. The heatsink of claim 7, wherein a height above said base upper surface to which said fins extend is greater than a gap between adjacent rows within said array by a factor in the range of approximately 10 to 20.

9. The heatsink of claim 8, wherein said height is in the range of approximately 30 to 40 mm and said gap between adjacent rows is in the range of approximately 1.5 to 4.0 mm.

10. The heatsink of claim 1, wherein said plurality of fins are integral with said conductive base.

11. The heatsink of claim 1, wherein said heat pipe casing comprises a material selected from the group consisting of copper and aluminum.

12. The heatsink of claim 1, wherein said heat pipe casing is substantially rectangular in cross section and wherein said first channel comprises a rectangularly shaped trench formed into said lower surface of said conductive base.

13. The heatsink of claim 1, wherein said heat pipe casing is substantially circular in cross section and further wherein said first channel comprises a circular tunnel.

14. The heatsink of claim 1, wherein said the pipe medium comprises a fluid selected from the group consisting of water, acetone, methanol, and ethanol.

15. The heatsink of claim 1, wherein said conductive base further defines a second channel, said second channel extending substantially perpendicularly to said first channel and wherein said heatsink further includes a second heat pipe contained within said second channel.

16. The heatsink of claim 15, wherein said conductive base further defines first and second diagonal channels, said diagonal channels extending between respective corners of said base and wherein said heatsink further includes first and second diagonal heat pipes contained respectively within said first and second diagonal channels.

17. The heatsink of claim 1, wherein said heatsink is configured to be affixed to a printed circuit board with said heat pipe aligned over a center of said integrated circuit and said lower surface of said heatsink in close proximity with an upper surface of said integrated circuit.

18. A motherboard for use in a computing system, said motherboard comprising:
   a printed circuit board;
   a central processing unit affixed to said printed circuit board;
   at least one random access memory device affixed to said circuit board and interfaced to said central processing unit; and
   a heatsink according to the heatsink of claim 1, wherein said heatsink is affixed to said printed circuit board with said heat pipe aligned over a center of said central processing unit and said lower surface of said heatsink in close proximity with an upper surface of said central processing unit.

* * * * *